United States Patent
Du et al.

(10) Patent No.: US 9,188,856 B2
(45) Date of Patent: Nov. 17, 2015

(54) TYPE OF FINE METAL MASK (FFM) USED IN OLED PRODUCTION AND THE METHOD OF MANUFACTURING IT

(71) Applicant: Zhongshan Aiscent Technologies, Inc., Zhongshan (CN)

(72) Inventors: Weichong Du, Zhongshan (CN); Jianwei Han, Zhongshan (CN); Wenhui Mei, Zhongshan (CN)

(73) Assignee: Zhongshan Aiscent Technologies Co., Ltd., Zhongshan (CN)

( * ) Notice: Subject to any disclaimer, the term of this patent is extended or adjusted under 35 U.S.C. 154(b) by 0 days.

(21) Appl. No.: 14/184,823

(22) Filed: Feb. 20, 2014

(65) Prior Publication Data

US 2015/0059643 A1  Mar. 5, 2015

(30) Foreign Application Priority Data

Sep. 5, 2013 (CN) .......................... 2013 1 0400757

(51) Int. Cl.
*G03F 7/00* (2006.01)
*C23F 1/02* (2006.01)
*C23C 14/04* (2006.01)

(52) U.S. Cl.
CPC ............ *G03F 7/0015* (2013.01); *C23C 14/042* (2013.01); *C23F 1/02* (2013.01); *G03F 7/00* (2013.01)

(58) Field of Classification Search
CPC ............. C23F 1/02; G03F 7/00; H05K 3/062; H05K 3/108; H05K 3/202
See application file for complete search history.

(56) References Cited

U.S. PATENT DOCUMENTS

| 4,894,125 A | * | 1/1990 | Fenolia et al. | 205/210 |
| 4,902,607 A | * | 2/1990 | Lee | 430/323 |
| 2012/0266813 A1 | * | 10/2012 | Hong | 118/505 |
| 2012/0307976 A1 | * | 12/2012 | Kaneko | 378/62 |

FOREIGN PATENT DOCUMENTS

CN          102569673 A       7/2012

* cited by examiner

*Primary Examiner* — Duy Deo

(57) ABSTRACT

A new type of fine metal mask (FMM) used in OLED production and the method of manufacturing it, wherein the FMM includes a frame made of a metal substrate with a plurality of through holes, a layer of fine mask electroformed on the surface of the frame so that said fine mask and said frame are seamlessly integrated, said fine mask is divided into a pattern area and a border area, and the pattern area corresponds to the through holes on the frame, and the method of manufacturing such an FMM comprising the steps of: A. providing a metal substrate by cutting an invar alloy or stainless steel plate to a desired size; B. providing an fine mask by adding a photoresist layer on the metal substrate, exposing a desired pattern onto said photoresist layer, and electroforming a metal base layer and a metal layer with a low thermal expansion coefficient; and C. etching the metal substrate by etching out a pattern area of the metal substrate that corresponds to the pattern area of said fine mask using a chemical etching method to form a plurality of through holes, and creating an outer border area and internal separation area for support of said fine mask.

7 Claims, 4 Drawing Sheets

TYPE OF FINE METAL MASK (FFM) USED IN OLED PRODUCTION AND THE METHOD OF MANUFACTURING IT

FIELD OF THE INVENTION

The method and system disclosed herein relate to semiconductor manufacturing technology, and more particularly, refer to a new type of fine metal mask (FMM) used in OLED production and the method of manufacturing it.

BACKGROUND OF THE INVENTION

For the production of high pixel density OLED (Organic Light Emitting Diode), a final metal mask (FFM) is commonly used as the mask in the vapor deposition of organic luminophore (three primary colors) within the pixel, which is quite thin and has a low coefficient of thermal expansion.

FFM used in OLED is commonly produced with invar steel through chemical etching The specific process is to coat the surface of invar steel with photoresist. Then, patterns of FFM will be transferred to the light sensitive layer by exposure. The final procedure will be completed by developing and chemical etching.

The normal thickness of FFM is only 30 to 200 μm. Due to its limited ductility and low thickness, it is extremely difficult to keep the FFM attached to the surface of a substrate (glass or flexible plate) with organic luminous sub-pixels and ensure high positional accuracy. It requires welding FFM to metal frames by laser. During the whole process, FFM is easily damaged or shifted because of uneven forces applied to it or thermal effect, etc. Besides, FFM should be regularly cleaned to avoid pattern deficiency caused by residual materials used in the manufacturing of OLED. Cleaning is prone to cause the damage of some pattern, so it is necessary to replace FFM every two months. All the above reasons make the use of FFM very expensive during the manufacture of OLED.

SUMMARY OF THE INVENTION

The object of the invention is to overcome the deficiencies of the prior technologies and to provide a new, effective, and low-cost type of fine metal mask.

Another object of the invention is to overcome the deficiencies of the prior technologies and to provide a method of producing a new, effective, and low-cost type of fine metal mask production.

The benefits of the invention include: the structure of FMM and frame is well integrated, increased strength of the FMM, eliminating the process of welding FMM to the frame, simplifying the production process and reducing production cost.

The FMM is electroformed to the surface of the frame (include an outer border area and internal separation area), without using the laser welding-assembly method that laser-welds FMM to the surface of the frame. It eliminates the potential effects of uneven tension applied to the FMM or thermal effects, which could result in shifting or damage to the very thin FMM.

DETAILED DESCRIPTION

Figure 1:
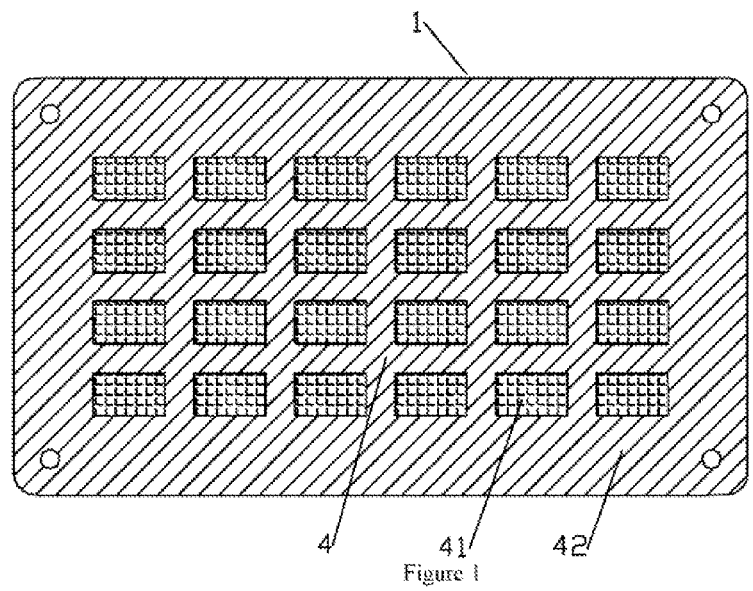
FIG. 1 is a front view of an FMM (front covered FMM).
Figure 2:
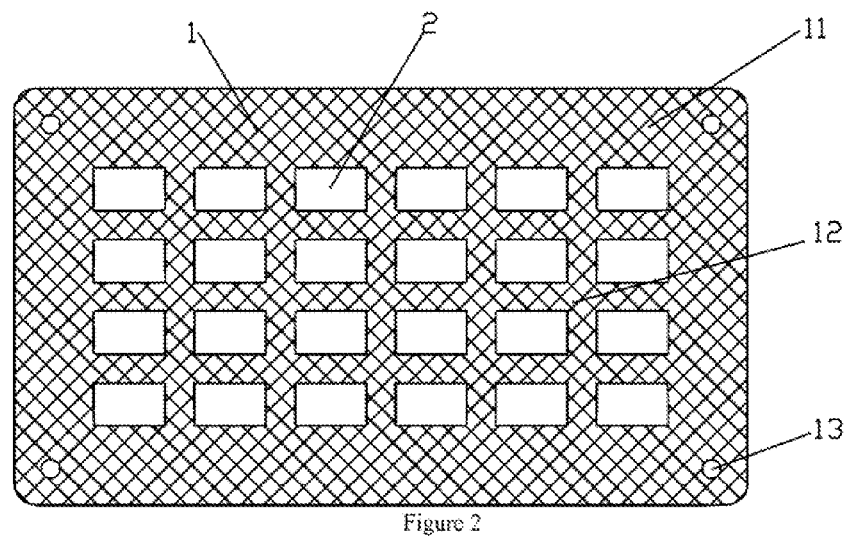
FIG. 2 is a back view of an FMM (metal substrate in this instance).
Figure 3:
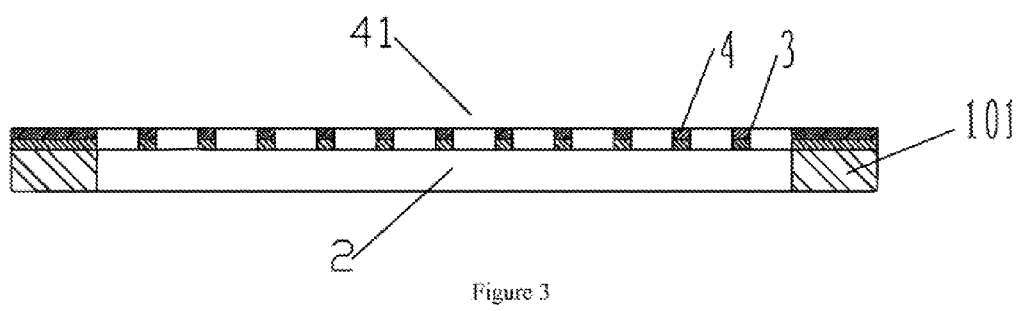
FIG. 3 is a cross-section view of an FMM showing a hole and the surrounding structure.
Figure 4:
FIG. 4 is a schematic diagram of the metal substrate of an FMM.
Figure 5:
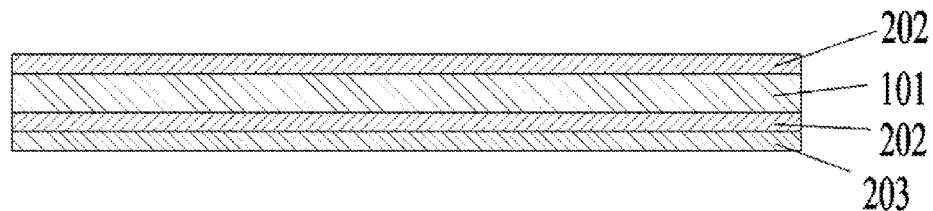
FIG. 5 a schematic diagram of coating a photoresist layer to the metal substrate of an FMM.
Figure 6:
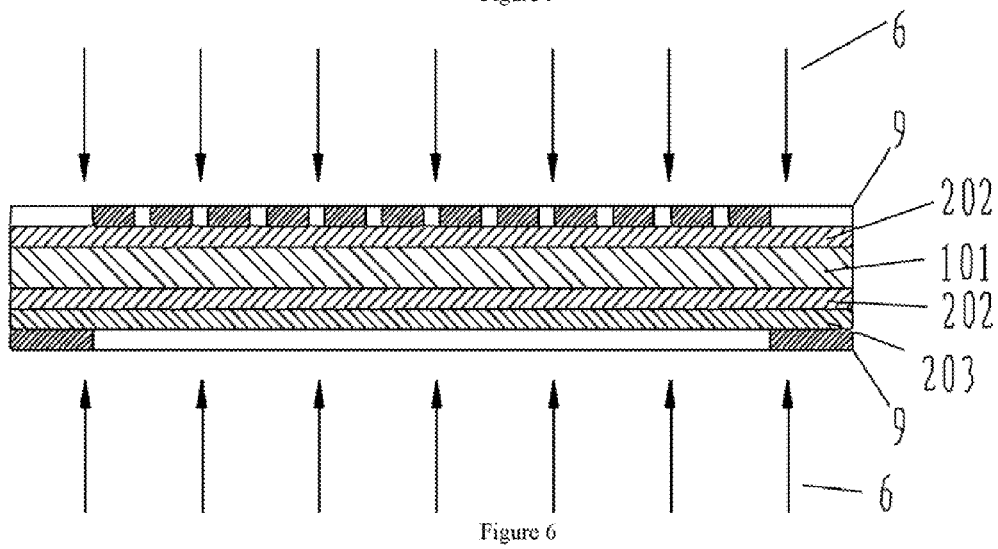
FIG. 6 is a schematic diagram showing the steps of exposing a photoresist layer on a metal substrate using a parallel exposure system.
Figure 7:
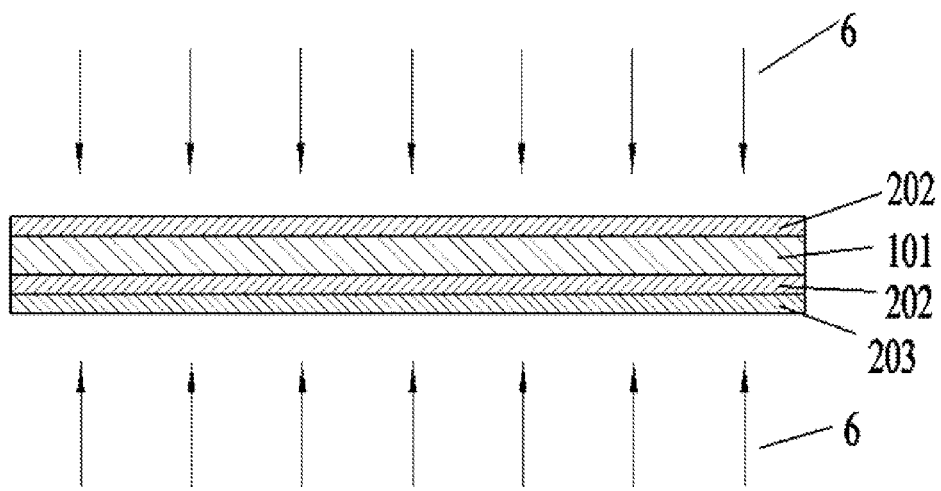
FIG. 7 is a schematic diagram showing the steps of exposing a photoresist layer on a metal substrate using a laser direct image exposure system.
Figure 8:
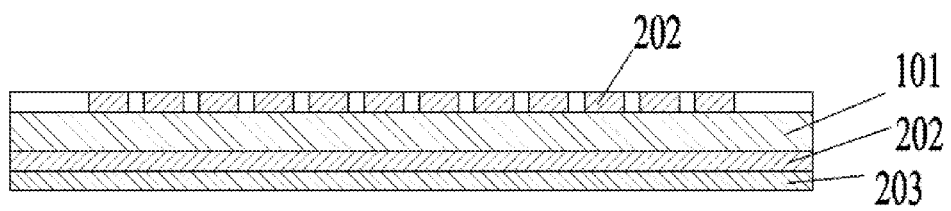
FIG. 8 is a schematic diagram showing the steps of developing the upper photoresist layer on a substrate.
Figure 9:
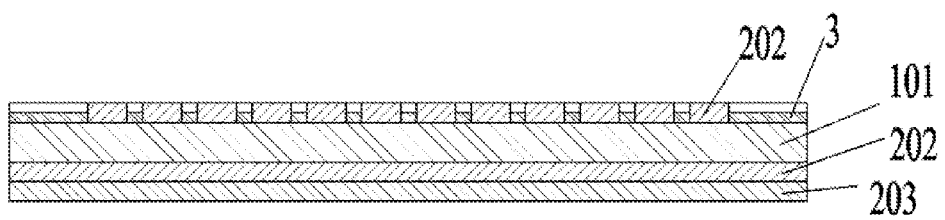
FIG. 9 is a schematic diagram showing the steps of electroforming a metal base layer to a substrate.
Figure 10:
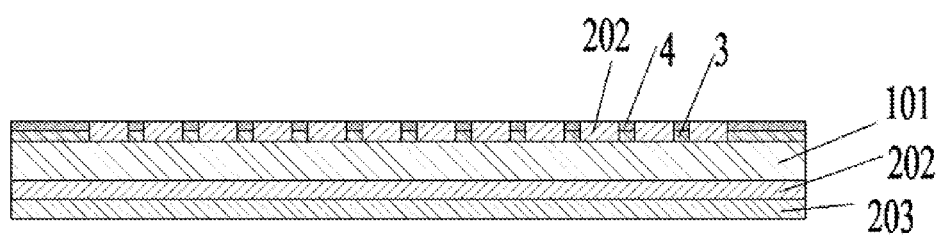
FIG. 10 is a schematic diagram showing the steps of electroforming an FMM.
Figure 11:
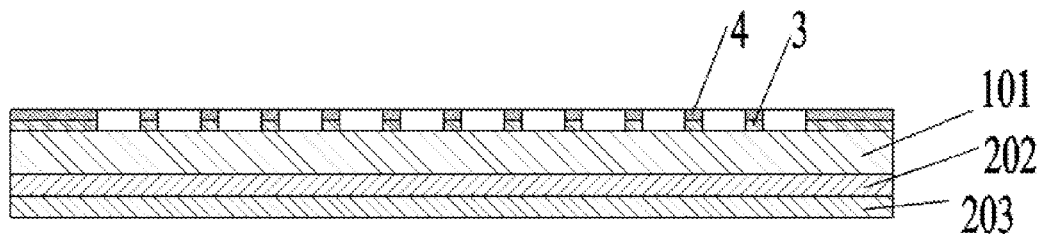
FIG. 11 is a schematic diagram showing the steps of removing a top photoresist layer on a substrate.
Figure 12:
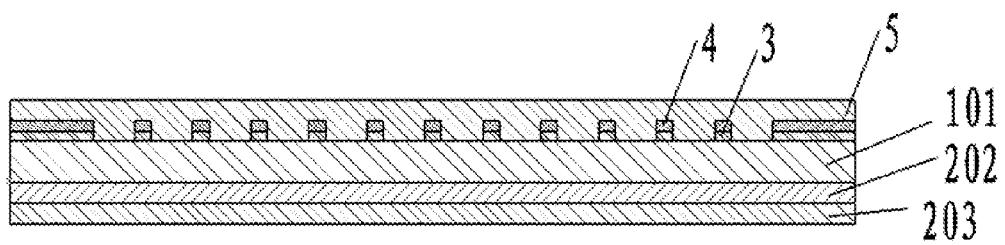
FIG. 12 is a schematic diagram showing the steps of adding a protective layer to an FMM.
Figure 13:
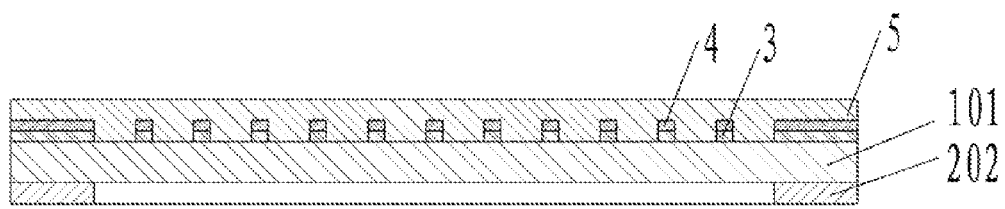
FIG. 13 is a schematic diagram showing the steps of developing the bottom photoresist layer on a metal substrate of an FMM.
Figure 14:
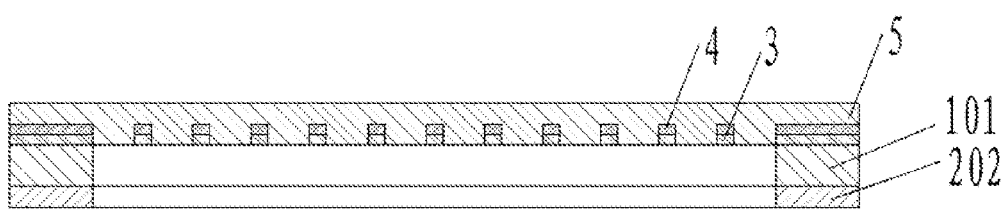
FIG. 14 is a schematic diagram showing the steps of etching the metal substrate of an FMM.
Figure 15:
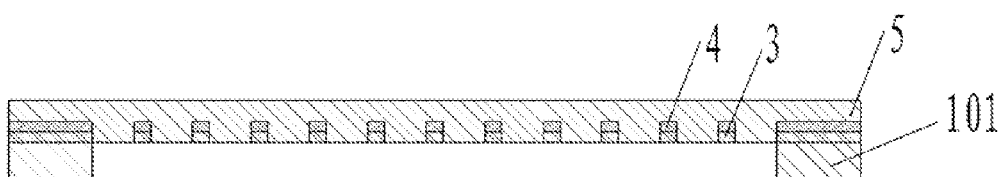
FIG. 15 is a schematic diagram showing the steps of removing the bottom photoresist layer on a metal substrate of an FMM.
Figure 16:
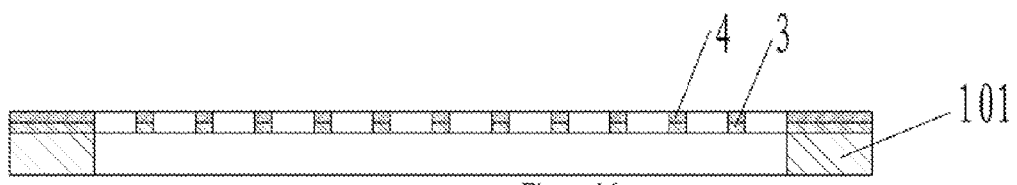
FIG. 16 is a schematic diagram showing the steps of removing the protective layer on a metal substrate of an FMM.

The following are detailed description of the present system and method with reference of the drawings:

As shown in FIGS. 1 and 2, a new type of fine metal mask (FMM) used in OLED production, include a frame (1) with an outer border area (11) and internal separation area (12), and the frame (1) has a plurality of through holes (2) in the metal substrate. There is a layer of fine metal mask formed by electroforming on the surface of the frame (1). Both the fine metal mask (4) and the frame are seamlessly integrated into one. The fine metal mask (4) includes a pattern area (41) and an outer border area (42), and there are a plurality of holes (13) in the outer border area (11) of the frame (1) to align with the fine metal mask. The number of alignment hole (13) is two or more than two, and there are 4 alignment holes as used in FIGS. 1 and 2. The pattern area (41) and holes (2) in the frame have the same corresponding size and position.

The cross-section view of the through holes (2) and the surrounding region structure are shown in FIGS. 3 to 15. The production processes are: first to electroform an fine metal mask (4) on the surface of a metal substrate (101); form through holes (2) by etching areas of the metal substrate that correspond to the pattern area (41) of the mask, and leave the outer border area (11) and internal separation area (12) to support the fine metal mask (4). The metal substrate (1) and the fine metal mask (4) form an integrated structure, and there is no need to combine them using the laser welding assembly method.

The material of the metal substrate or frame (1) is INVAR alloy or stainless steel. The material of the fine metal mask (4) is metal with low coefficient of thermal expansion, such as nickel, molybdenum, chromium, platinum, tin, or a ferronickel alloy containing two or more of the foregoing metals.

The following are three exemplary methods of making an fine metal mask as disclosed herein.

The First Embodiment

First embodiment of manufacturing an fine metal mask used in OLED production includes the following steps:

1. Clean a 1 mm±5 μm invar steel substrate (101) by acid, organic solvent and deionized water ultrasonic for about 5-15 min, and then dry the substrate in clean drying box.

2. Coat both sides of the invar steel substrate (101) with a 55 μm photoresist layer (202), and the bottom photoresist layer (202) with a layer of photoresist protective film (203).

3. Expose the top and bottom photoresist layers (202) at the same time by the parallel light from a laser direct image exposure machine wherein the pattern that needs to be exposed has been imported into computer.

4. Develop the top photoresist layer (202) formed in the step 3, and wash away the soluble composition until the surface of invar steel substrate (101) of pattern region (41) and frame region (42) (include an outside border area and an inside separation area) are exposed to air.

5. Electroform a platinum layer as a metal base layer (3) on the top of invar steel substrate (101) formed in step 4, the thickness of platinum layer is approximately 1 μm.

6. Electroform a 40 μm ferronickel alloy (4) that has low coefficient of thermal expansion on the top of the metal base layer (3).

7. Remove the undissolved photoresist layer (202) left in step 6 from the upper surface of invar steel.

8. Coat a layer of molten paraffin as a protective covering (5) to the exposed areas of top surfaces in invar steel substrate (101) formed in step 7.

9. Remove the Photoresist protective film (203) on the bottom surface of invar steel substrate (101), and then develop the photoresist layer (202) until the pattern region (7) of the invar steel substrate (101) is exposed.

10. Etch the pattern region (7) of the invar steel substrate (101) until the platinum base layer (3) is exposed, 11. Remove the residual photoresist layer (202) from step 10 from the bottom surface of substrate 101.

12. Remove the protective layer (5) i.e., the paraffin layer.

The final product from steps above is an FFM that uses invar steel as the metal substrate, whose fine metal mask is formed by electroforming ferronickel alloy that has low coefficient of thermal expansion. In addition, the frame region including outside border area and inside separation area are combined with the ferronickel alloy mask into a fully integrated structure.

The Second Embodiment

Second embodiment of manufacturing an fine metal mask used in OLED production includes the following steps:

1. Clean 1.2 mm±5 μm stainless steel, substrate (101) by acid, organic solvent and deionized water ultrasonic about 15 min, and then drying in clean drying box.

2. Coat the top and bottom surface of the stainless steel substrate (101) with a 45 μm photoresist layer (202), and cover the bottom photoresist layer (202) with a layer of photoresist protective film (203).

3. Attach a film (or mask) (9) to the top photoresist layer (202), then expose using the parallel light (6) from a parallel exposure machine.

4. Attach a film (or mask) (9) to the bottom photoresist layer (202), then expose using the parallel light (6) from a parallel exposure machine.

5. Develop the top photoresist layer (202) formed in step 4, and wash the soluble composition away until the pattern region (41) on the surface of the stainless steel substrate (101) and the frame region (42) (include an outside border area and an inside separation area) are exposed to air.

6. Electroform a gold layer as a metal base layer (3) on top of the stainless steel substrate (101) formed in step 5, the thickness of the base layer is approximately 0.5 μm.

7. Electroform a 35 μm nickel layer (4) that has low coefficient of thermal expansion on the top of the metal base layer (3)

8. Remove the undissolved photoresist layer (202) left in step 7 from the top surface of the stainless steel substrate.

9. Coat a layer of plastic film as protective covering (5) to the exposed areas of top surface of the stainless steel substrate (101) formed in step 8.

10. Remove the photoresist protective film (203) on the bottom surface of stainless steel substrate (101), and then develop the photoresist layer (202) until the pattern region (7) of the stainless steel substrate (101) is exposed to air.

11. Etch the pattern region (7) of the stainless steel substrate (101) until the gold base layer (3) is exposed.

12. Remove the undissolved photoresist layer (202) left in step 11 from the bottom surface of substrate (101).

13. Remove the protective covering (5) (plastic film) left in step 12 from the surface of the finished FFM product.

The final product from steps above is an FFM that using a stainless steel sheet as the metal substrate, whose fine pattern region is formed by electroforming a nickel layer that has low coefficient of thermal expansion. In addition, the frame region including outside border area and inside separation area are combined with the nickel layer into a fully integrated structure.

The Third Embodiment

Third embodiment of manufacturing a fine metal mask used in OLED production includes the following steps:

1. Clean a 1.5 mm±5 μm invar steel substrate (101) by acid, organic solvent and deionized water ultrasonic about 15 min, and then drying in clean drying box.

2. Coat the top and bottom surface of the invar steel substrate (101) with a 50 μm photoresist layer (202), and cover the bottom photoresist layer (202) with a layer of photoresist protective film (203).

3. Expose the top photoresist layer (202) by the parallel light (6) from a laser direct image exposure system (Patterns that need to be exposed through light have been imported into a computer).

4. Expose the bottom photoresist layer (202) by the parallel light (6) from a laser direct image exposure system (Patterns that need to be exposed through light have been imported into a computer).

5. Develop the top photoresist layer (202) formed in step 4, and wash the soluble composition away until the pattern region (41) on the surface of the invar steel substrate (101) and the frame region (42) (include an outside border area and an inside separation area) are exposed to air again.

6. Electroform a layer of silver as a metal base layer (3) on the top of invar steel substrate (101) formed in step 5, the thickness of silver layer is approximately 1.5 μm.

7. Electroform a 35 μm molybdenum layer (4) that has low coefficient of thermal expansion on the top of the metal base layer (3)

8. Remove the undissolved photoresist layer (202) left in step 7 from the top surface of the invar steel substrate.

9. Attach a well-sealed metal protective cover (5) to the exposed areas of upper surfaces of the invar steel substrate (101) formed in step 8.

10. Remove the photoresist protective film (203) on the bottom surface of the invar steel substrate (101), and then develop the lower photoresist (202) until the pattern region (7) of the invar steel substrate (101) is exposed to air.

11. Etch the pattern region (7) of the invar steel substrate (101) until the silver layer (3) is exposed to air.

12. Remove the undissolved photoresist layer (202) left in step 11 from the bottom surface of the substrate (101).

13. Remove the protective cover (5) (metal protective cover) left in step 12 from the top surface of the finished FFM product.

The final product from the steps above is an FFM that using invar steel as the metal substrate, whose fine pattern region is formed by electroforming molybdenum layer that has low coefficient of thermal expansion. In addition, the frame region including outside border area and inside separation area are combined with the molybdenum layer into a fully integrated structure.

While the system and methods have been particularly shown and described with reference to the preferred embodiment thereof, it will be understood by those skilled in the art that various modifications, additions and substitutions in form and detail may be made therein without departing form the spirit and scope of the invention, as set forth in the following claims.

What is claimed is:

1. A method of manufacturing a fine metal mask with an integrated metal substrate for support comprising the steps of:
    A. Providing a metal substrate by cutting an invar alloy or stainless steel plate to a desired size;
    B. Providing an fine mask b adding a photoresist layer on the metal substrate, exposing a desired pattern onto said photoresist layer, and electroforming a metal base layer and a metal layer with a low thermal expansion coefficient;
    C. Etching the metal substrate by etching out a pattern area of the metal substrate that corresponds to the pattern area of said fine mask using a chemical etching method to form a plurality of through holes, and creating an outer border area with a plurality of alignment through holes and internal separation area for support of said fine mask; and
    D. wherein said fine mask is integrated with said metal substrate; and said outer border and plurality of through holes are designed for fixing said fine mask to the surface of a substrate.

2. The method of claim 1 wherein step B further comprising the steps of:
    $B_1$. Cleaning said metal substrate by acid, organic solvent and deionized water ultrasonic for about 5 to 15 minutes and drying in a clean drying box;
    $B_2$. Coating a photoresist layer on both sides of the metal substrate and adding a protective film on the surface of the bottom photoresist layer;
    $B_3$. Exposing a pattern onto the photoresist layer using one of the following two methods:
    Using, a traditional exposure system by placing a patterned film or mask on both sides of the metal substrate and then exposing the pattern from the film or mask onto the photoresist layers on both sides of the metal substrate; or
    Using a Laser Direct Image (LDI) exposure system by importing a pattern into a computer and exposing onto the photoresist layers on both sides of the metal substrate by scanning using the LDI;
    $B_4$. Developing the pattern on the top photoresist layer, washing away the soluble composition in the photoresist layer, and exposing the surface of the pattern area and the outer border area of the metal substrate to air;
    $B_5$. Electroforming a metal base layer on the exposed metal substrate using a metal with high electric conductivity and stable chemical properties;
    $B_6$. Forming a fine mask by electroforming a metal layer on the top of the metal base layer by using a metal with low thermal expansion coefficient; and
    $B_7$. Removing the residual portion of the photoresist layer after step $B_6$.

3. The method of claim 2, wherein step C further comprising the steps of:
    $C_1$. Adding a protective layer to the upper surface of the metal substrate from step $B_7$;
    $C_2$. Developing the bottom photoresist layer of the metal substrate by removing the protective film, developing the bottom photoresist layer, and exposing the corresponding pattern area of the metal substrate;
    $C_3$. Etching the pattern area of the metal substrate until the metal base layer is exposed to air wherein the metal base layer is used to protect the pattern area of the top layer from etching;
    $C_4$. Removing the residual portion of the photoresist layer from step $C_3$;
    $C_5$. Removing the protective layer.

4. The method of claim 2 wherein the thickness of the metal substrate ranges from 0.5 mm to 5 mm, the thickness of the photoresist layer ranges from 0.01 μm to 200 μm, the thickness of the metal base layer ranges from 0.1 λm to 4 λm, and the thickness of the fine metal mask ranges from 10 λm to 200 λm.

5. The method of claim 2 wherein the metal base layer is made from one of copper, silver, platinum, or gold; and the protective layer is made of one of paraffin, photoresist, plastic film, metal protective cover, or non-metal protective cover.

6. The method of claim 3 wherein the thickness of the metal substrate ranges from 0.5 mm to 5 mm, the thickness of the photoresist layer rangers from 1 λm to 200 λm, the thickness of the metal base layer ranges from 0.1 λm to 4 λm, and the thickness of the fine metal mask ranges from 10 λm to 200 λm.

7. The method of claim 3 wherein the metal base layer is made from one of copper, silver, platinum, or gold; and the protective layer is made of one of paraffin, photoresist, plastic film, metal protective cover, or non-metal protective cover.

\* \* \* \* \*